(12) United States Patent
Hidaka et al.

(10) Patent No.: US 6,868,004 B2
(45) Date of Patent: Mar. 15, 2005

(54) THIN FILM MAGNETIC MEMORY DEVICE SUPPRESSING RESISTANCE OF TRANSISTORS PRESENT IN CURRENT PATH

(75) Inventors: Hideto Hidaka, Hyogo (JP); Masatoshi Ishikawa, Hyogo (JP); Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/384,741

(22) Filed: Mar. 11, 2003

(65) Prior Publication Data

US 2004/0052108 A1 Mar. 18, 2004

(30) Foreign Application Priority Data

Sep. 13, 2002  (JP) ........................................ 2002-268612

(51) Int. Cl.⁷ .............................................. G11C 11/14
(52) U.S. Cl. ........................................ 365/171; 365/157
(58) Field of Search ................................ 365/171, 173, 365/51, 148, 157

(56) References Cited

U.S. PATENT DOCUMENTS 6,423,584 B2 * 7/2002 Takahashi et al. .......... 438/152

6,614,681 B2 * 9/2003 Hidaka ........................ 365/171

OTHER PUBLICATIONS

Roy Scheuerlein et al., "A 10ns Read and Write Non-Volatile Memory Array using a Magnetic Tunnel Junction and FET Switch in Each Cell," ISSCC Digest of Technical Papers, Feb. 2000, pp. 94–95, 128–129, 409–410, Paper TA 7.2.

M. Durlam, et al., "Nonvolatile RAM based on Magnetic Tunnel Junction Elements," ISSCC Digest of Technical Papers, Feb. 2000, pp. 96–97, 130–131, 410–411, Paper TA 7.3.

Peter K. Naji et al., "A 256kb 3.0V 1T1MTJ Nonvolatile Magnetoresistive RAM," ISSCC Digest of Technical Papers, Feb. 2001, pp. 94–95, 122–123, 404–405, 438, Paper TA 7.6.

* cited by examiner

*Primary Examiner*—Vu A. Le
(74) *Attorney, Agent, or Firm*—Burns, Doane, Swecker & Mathis, L.L.P.

(57) ABSTRACT

An access transistor ATR in an MTJ memory cell, which is one of transistors connected to a read current path, is constituted with a surface-channel, field-effect transistor. The surface-channel, field-effect transistor has a channel resistance lower than a channel-embedded, field-effect transistor, and can reduce an RC load in the read current path. Accordingly, data can be read with a high speed.

30 Claims, 10 Drawing Sheets

THIN FILM MAGNETIC MEMORY DEVICE SUPPRESSING RESISTANCE OF TRANSISTORS PRESENT IN CURRENT PATH

BACKGROUND OF THE INVENTION

1. Field of the Invention

The present invention relates to a thin film magnetic memory device, and more particularly, to a thin film magnetic memory device including a memory cell having a magnetic tunnel junction (MTJ).

2. Description of the Background Art

Recently, an MRAM (Magnetic Random Access Memory) device has attracted attention as a new-generation non-volatile memory device. The MRAM device is a non-volatile memory device storing data in a non-volatile manner with a plurality of thin film magnetic elements formed on a semiconductor integrated circuit, and allowing random access to each thin film magnetic element.

Particularly, it has been disclosed that a performance of the MRAM device is remarkably enhanced by employing a thin film magnetic element using the magnetic tunnel junction as a memory cell in recent days.

FIG. 8 is a schematic diagram showing a configuration of the memory cell having the magnetic tunnel junction (hereinafter, simply referred to as an "MTJ memory cell").

Referring to FIG. 8, the MTJ memory cell includes a tunneling magneto-resistance element TMR having an electric resistance variable in accordance with a data level of magnetically written storage data, and an access transistor ATR. Access transistor ATR is connected in series to tunneling magneto-resistance element TMR between a bit line BL and a source voltage line SL. Typically, a field-effect transistor formed on a semiconductor substrate is employed as access transistor ATR.

Provided for the MTJ memory cell are bit line BL and a digit line DL for feeding a data write current in a different direction respectively in data write, a read word line RWL for instructing data read, and source voltage line SL for pulling down tunneling magneto-resistance element TMR to ground voltage GND in data read. In data read, in response to turn-on of access transistor ATR, tunneling magneto-resistance element TMR is electrically coupled between source voltage line SL and bit line BL.

FIG. 9 is a conceptual view illustrating a data write operation into the MTJ memory cell.

Referring to FIG. 9, the tunneling magneto-resistance element TMR includes a ferromagnetic material layer FL having a constant, fixed magnetic direction (hereinafter, simply referred to as a "fixed magnetic layer"), and a ferromagnetic material layer VL magnetized in a direction in accordance with an externally applied magnetic field (hereinafter, simply referred to as a "free magnetic layer"). A tunneling barrier (a tunneling film) TB formed with an insulating film is provided between fixed magnetic layer FL and free magnetic layer VL. Free magnetic layer VL is magnetized in a direction identical or opposite to fixed magnetic layer FL, in accordance with a level of the written storage data. These fixed magnetic layer FL, tunneling barrier TB, and free magnetic layer VL form the magnetic tunnel junction.

The electric resistance of tunneling magneto-resistance element TMR varies in accordance with a relative relation in respective magnetic directions of fixed magnetic layer FL and free magnetic layer VL. Specifically, the electric resistance of tunneling magneto-resistance element TMR is set to a minimum value Rmin when the fixed magnetic layer FL is magnetized in a direction identical to (in parallel with) that of free magnetic layer VL, while it is set to a maximum value Rmax when one of the above layers is magnetized in a direction opposite (antiparallel) to the other.

In data write, read word line RWL is inactivated, and access transistor ATR is turned off. In such a state, the data write current for magnetizing free magnetic layer VL flows in a direction in accordance with the level of the write data, respectively through bit line BL and digit line DL.

FIG. 10 is a conceptual view showing a relation of the data write current with the magnetic direction of the tunneling magneto-resistance element in data write.

Referring to FIG. 10, the abscissa H (EA) represents a magnetic field applied in a direction of an easy axis (EA) in free magnetic layer VL within tunneling magneto-resistance element TMR. On the other hand, the ordinate H (HA) represents a magnetic field acting in a direction of a hard axis (HA) in free magnetic layer VL. Magnetic fields H (EA) and H (HA) correspond to respective one of two magnetic fields produced by the current flowing in bit line BL and digit line DL respectively.

In the MTJ memory cell, the fixed magnetic direction of fixed magnetic layer FL extends along the easy axis of free magnetic layer VL, while free magnetic layer VL is magnetized along the easy axis in a direction parallel or anti-parallel (opposite) to fixed magnetic layer FL, in accordance with the level of the storage data ("1" and "0"). The MTJ memory cell can store 1-bit data ("1" and "0"), corresponding to two magnetic directions of free magnetic layer VL.

The magnetic direction of free magnetic layer VL can be rewritten only when the sum of the applied magnetic fields H (EA) and H (HA) reaches a region outside an asteroid characteristic line shown in FIG. 10. In other words, if the applied data write magnetic field has intensity within a region inside the asteroid property line, the magnetic direction of free magnetic layer VL does not vary.

As shown with the asteroid characteristic line, a magnetization threshold value necessary for varying the magnetic direction along the easy axis can be lowered by applying a magnetic field in the direction of hard axis to free magnetic layer VL. When an operation point in data write is designed as in an example shown in FIG. 10, in the MTJ memory cell to which data is written, the data write magnetic field in the direction of the easy axis is designed to have an intensity $H_{WR}$. In other words, a value of the data write current fed through bit line BL or digit line DL is designed so as to obtain data write magnetic field $H_{WR}$. Generally, data write magnetic field $H_{WR}$ is shown with the sum of switching magnetic field $H_{SW}$ necessary for switching the magnetic direction and a margin $\Delta H$. That is, it is shown with $H_{WR}=H_{SW}+\Delta H$.

In order to rewrite the storage data in the MTJ memory cell, that is, the magnetic direction of tunneling magneto-resistance element TMR, the data write current at a prescribed level or higher should be fed through both digit line DL and bit line BL. Thus, free magnetic layer VL in tunneling magneto-resistance element TMR is magnetized in a direction parallel or opposite (antiparallel) to fixed magnetic layer FL in accordance with an orientation of the data write magnetic field along the easy axis (EA). The magnetic direction once written in tunneling magneto-resistance element TMR, that is, the storage data in the MTJ memory cell, is held in a non-volatile manner until new data write is carried out.

FIG. 11 is a conceptual view illustrating a data read operation from the MTJ memory cell.

Referring to FIG. 11, in the data read operation, access transistor ATR turns on in response to activation of read word line RWL. Thus, tunneling magneto-resistance element TMR is electrically coupled to bit line BL, while it is pulled down to ground voltage GND.

In such a state, when bit line BL is pulled up to a prescribed voltage, a memory cell current Icell in accordance with the electric resistance of tunneling magneto-resistance element TMR, that is, in accordance with the level of the storage data in the MTJ memory cell, passes through a current path including bit line BL and tunneling magneto-resistance element TMR. For example, by comparing memory cell current Icell with a prescribed reference current, the storage data can be read from the MTJ memory cell.

Here, generally, memory cell current Icell is designed to be lower by 1 to 2 digits than the above-described data write current. Therefore, it is unlikely that the storage data in the MTJ memory cell is inadvertently rewritten due to an effect of memory cell current Icell. In other words, non-destructive data read is possible.

FIG. 12 shows a first configuration example of the MTJ memory cell connected on the semiconductor substrate.

Referring to FIG. 12, access transistor ATR formed on a semiconductor substrate SUB includes impurity regions 110 and 120 which are of n-type, and a gate region 130. Impurity region 110 is electrically coupled to source voltage line SL via a metal film formed in a contact hole 131.

Digit line DL is formed in a metal interconnection layer provided above source voltage line SL. Tunneling magneto-resistance element TMR is disposed on the upper side of digit line DL. Tunneling magneto-resistance element TMR is electrically coupled to impurity region 120 in access transistor ATR via a strap 150 and a metal film formed in a contact hole 140. Strap 150 is provided so as to electrically couple tunneling magneto-resistance element TMR to access transistor ATR, and formed with a conductive material. Bit line BL is electrically coupled to tunneling magneto-resistance element TMR, and provided on the upper side of tunneling magneto-resistance element TMR.

Bit line BL through which the data write current and a read current is fed, and digit line DL through which the data write current is fed are formed with the metal interconnection layer. Meanwhile, since read word line RWL is provided so as to control a gate voltage of access transistor ATR, it is not necessary to actively feed the current. Therefore, in the viewpoint of higher integration, read word line RWL is generally formed in the same interconnection layer as gate region 130, using a polysilicon layer, a polycide layer or the like, without newly providing an independent metal interconnection layer.

FIG. 13 shows a second configuration example of the MTJ memory cell fabricated on the semiconductor substrate.

Referring to FIG. 13, the second configuration example is different in that source voltage line SL is not formed with the metal interconnection layer in order to reduce the number of the metal interconnection layers necessary in the structure of the MTJ memory cell. Impurity regions 110 corresponding to source side are electrically coupled to each other between access transistors ATR adjacent in a direction of row or column, and coupled to ground voltage GND, thereby acting as a source voltage line.

Accordingly, digit line DL and bit line BL formed in metal interconnection layers M2 and M3 respectively in the first configuration example shown in FIG. 12 are formed in metal interconnection layers M1 and M2 respectively. Thus, in the second configuration example, the number of metal interconnection layers necessary for forming these signal lines is reduced by one, compared to the first configuration example. Therefore, higher integration of the MTJ memory cell can be implemented.

FIG. 14 shows a third configuration example of the MTJ memory cell fabricated on the semiconductor substrate.

Referring to FIG. 14, the third configuration example is different in that digit line DL is disposed above the metal interconnection layer for bit line BL.

Accordingly, digit line DL and bit line BL formed in metal interconnection layers M1 and M2 respectively in the second configuration example shown in FIG. 13 are formed in metal interconnection layers M2 and M1 respectively. In other words, digit line DL is formed in the metal interconnection layer above the metal interconnection layer constituting bit line BL. Thus, as shown in FIG. 14, digit line DL can be formed above impurity region 120, not above gate region 130. Accordingly, a region for strap 150 can be made smaller, and the size of the transistor can further be reduced. Higher integration of the MTJ memory cell can further be improved.

As described above, the MRAM device can realize non-volatile data storage with the MTJ memory cell integrated and disposed on the semiconductor substrate. In each MTJ memory cell, tunneling magneto-resistance element TMR has an electric resistance variable in accordance with the magnetic direction rewritable by the applied data write magnetic field. Therefore, by associating electric resistance Rmax and Rmin of tunneling magneto-resistance element TMR with the level of the storage data ("1" and "0") respectively, non-volatile data storage can be realized.

As described with reference to FIG. 11, data read in the MRAM device is carried out by detecting as a read current, memory cell current Icell reflecting the electric resistance of a selected memory cell, or another current in accordance with the memory cell current, for example, by a sense amplifier.

A number of transistors that are turned on in data read, however, are connected to such a path for the read current (hereinafter, referred to as a "read current path"). For example, in a configuration in which a word line is disposed corresponding to a memory cell row, while a bit line is disposed corresponding to a memory cell column, access transistor ATR in the selected memory cell is connected to a select bit line contained in the read current path. In addition, a column select gate provided corresponding to each bit line and selecting a corresponding bit line also turns on, and electrically connects the select bit line to the sense amplifier and the like.

Since the read current passes through the transistors that have turned on in the sense amplifier, the read current in accordance with the sum of the resistance of the transistors and the electric resistance of the selected memory cell is detected. Therefore, as the resistance of the transistors increases, the read current does not necessarily reflect the electric resistance of the selected memory cell, which may lead to misread. In addition, due to the effect of the resistance of the transistors, sensing operation may consume time, and high-speed data read may adversely be affected.

Particularly, in the general MTJ memory cell, a value for the electric resistance is of the order of several tens of KΩ, and the voltage applied to the MTJ memory cell in data read is suppressed approximately to 0.5V, considering reliability and the like of the tunneling film (insulating film). Therefore, the above read current remains at the order of micro ampere ($\mu$A: $10^{-6}$A). Accordingly, in order to carry out high-speed data read, an effect of the resistance of those transistors should be suppressed so as to sufficiently secure the read current difference.

SUMMARY OF THE INVENTION

The present invention was made to solve the above-described problems. An object of the present invention is to provide a thin film magnetic memory device capable of carrying out data read with high speed and without misread by suppressing a resistance of transistors interposed in a read current path.

A thin film magnetic memory device according to one aspect of the present invention includes a plurality of magnetic memory cells, a data line, and a peripheral circuit. The plurality of magnetic memory cells are arranged in matrix, and include a magneto-resistance element each having an electric resistance variable in accordance with magnetically written storage data. Through the data line, a read current is fed in data read, in accordance with the storage data of a selected memory cell corresponding to an address signal among the plurality of magnetic memory cells. The peripheral circuit carries out data read and data write for the selected memory cell. In addition, the peripheral circuit includes a sense amplifier circuit reading the storage data in the selected memory cell based on the read current. Further, some of the transistors allowing passage of the read current are designed to have a channel resistance per a unit size lower than at least some transistors having a maximum channel resistance per a unit size among transistors in the peripheral circuit.

The thin film magnetic memory device according to the present invention can suppress the channel resistance in turn-on in the transistors connected to the read current path. Therefore, a main advantage of the present invention is that an RC load in the read current path can be reduced, and that high-speed data read can be realized by suppressing the channel resistance of the transistors.

A thin film magnetic memory device according to yet another aspect of the present invention includes a plurality of magnetic memory cells, a data line, and a peripheral circuit. The plurality of magnetic memory cells are arranged in matrix, and include a magneto-resistance element each having an electric resistance variable in accordance with magnetically written storage data. Through the data line, a read current is fed in data read, in accordance with the storage data of a selected memory cell corresponding to an address signal among the plurality of magnetic memory cells. The peripheral circuit carries out data read and data write for the selected memory cell. In addition, the peripheral circuit includes a sense amplifier circuit reading the storage data in the selected memory cell based on the read current. Further, some of the transistors allowing passage of the read current are designed to have an absolute value for a threshold voltage lower than at least some of transistors having a maximum absolute value for the threshold voltage among transistors in the peripheral circuit.

The thin film magnetic memory device according to the present invention is designed to have low threshold voltage in turn-on in at least some of transistors connected to the read current path. Therefore, the present invention is that a RC load in the read current path can be reduced, and that high-speed data read can be realized.

A thin film magnetic memory device according to yet another aspect of the present invention includes a plurality of magnetic memory cells, a data line, and a peripheral circuit. The plurality of magnetic memory cells are arranged in matrix, and include a magneto-resistance element each having an electric resistance variable in accordance with magnetically written storage data. Through the data line, a read current is fed in data read, in accordance with the storage data of a selected memory cell corresponding to an address signal among the plurality of magnetic memory cells. The peripheral circuit carries out data read and data write for the selected memory cell. In addition, the peripheral circuit includes a sense amplifier circuit reading the storage data in the selected memory cell based on the read current. Further, some of the transistors allowing passage of the read current are designed to have a gate length shorter than at least some of transistors having a maximum gate length among transistors in the peripheral circuit.

The thin film magnetic memory device according to the present invention is designed to have a short gate length in at least some of transistors connected to the read current path. Therefore, the present invention is that a RC load in the read current path can be reduced, and that high-speed data read can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail with reference to the figures. It is First Embodiment Referring to FIG. 1, an MRAM device 1 according to the first embodiment of the present invention includes a memory cell array 10 formed with a plurality of MTJ memory cells MC arranged in n rows and m columns (n, m: a natural number), a row decoder 20 performing row select in memory cell array 10 based on a row address RA, and a column decoder 25 performing column select in memory cell array 10 based on a column address CA.

In memory cell array 10, read word lines RWL1–RWLn, digit lines DL1–DLn, and source voltage lines SL1–SLn are disposed corresponding to a memory cell row respectively, and bit lines BL1–BLm are provided corresponding to a memory cell column respectively. In the following, read word lines RWL1–RWLn, digit lines DL1–DLn, bit lines BL1–BLm, and source voltage lines SL1–SLn are collectively denoted as read word line RWL, digit line DL, bit line BL, and source voltage line SL, respectively. In addition, binary states, that is, a high voltage state (power supply voltage Vcc, for example) and a low voltage state (ground voltage GND, for example) of a signal, a signal line and data are referred to as "H level" and "L level" respectively.

Figure 8:
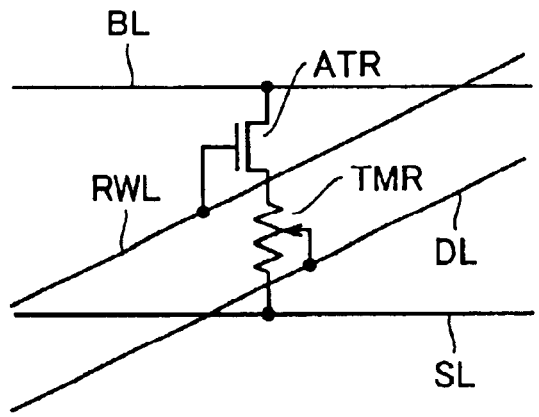
FIG. 8 is a schematic diagram showing a configuration of a memory cell having a magnetic tunnel junction.
Figure 9:
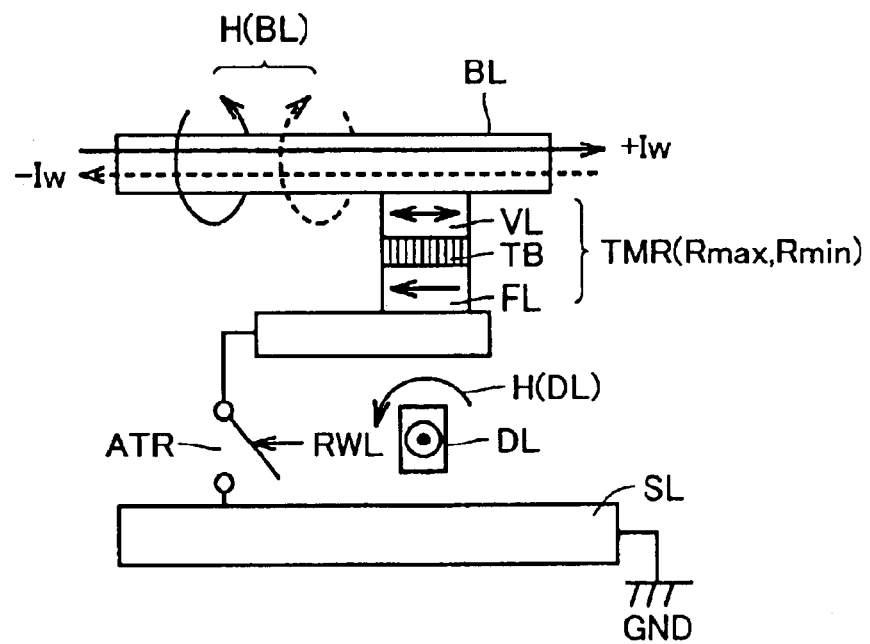
FIG. 9 is a conceptual view illustrating a data write operation into an MTJ memory cell.
Figure 10:
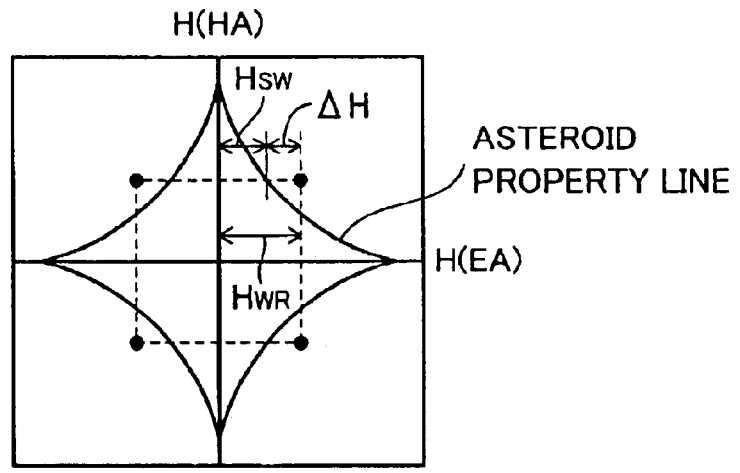
FIG. 10 is a conceptual view showing a relation of a data write current with a magnetic direction of a tunneling magneto-resistance element in data write.
Figure 11:
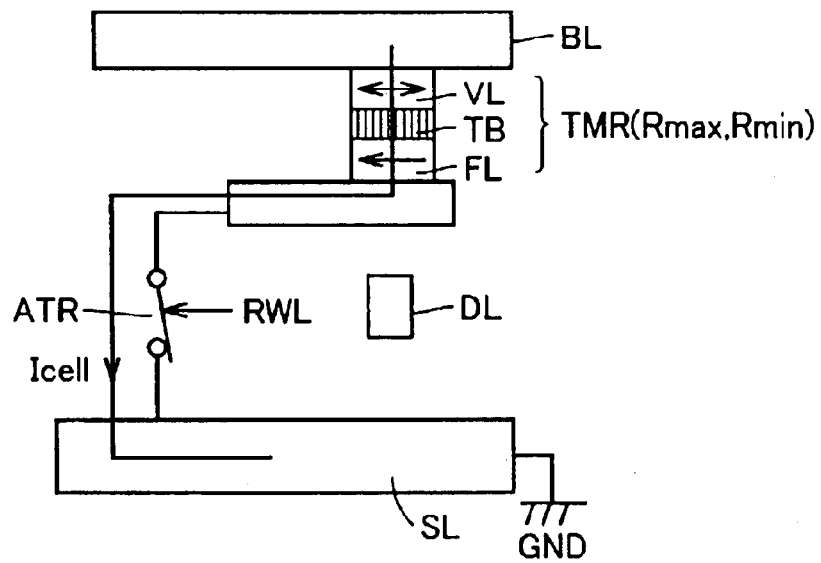
FIG. 11 is a conceptual view illustrating a data read operation from the MTJ memory cell.

Each MTJ memory cell MC is configured in the same manner as shown in FIG. 8, and includes tunneling magneto-resistance element TMR and access transistor ATR connected in series between corresponding bit line BL and source voltage line SL. Access transistor ATR has the gate connected to corresponding read word line RWL. Access transistor ATR has a source supplied with ground voltage GND by corresponding source voltage line SL. Tunneling magneto-resistance element TMR is magnetized in a direction in accordance with the storage data, and has electric resistance of either Rmax or Rmin.

To be strict, though the electric resistance of each MTJ memory cell is the sum of on-resistance of tunneling magneto-resistance element TMR and access transistor ATR, and other parasitic resistance, the resistance other than that of tunneling magneto-resistance element TMR is constant regardless of the storage data. Therefore, in the following, two types of electric resistance of a normal memory cell in accordance with the storage data are represented as Rmax and Rmin, and the difference therebetween is represented as $\Delta R$ (that is, $\Delta R = Rmax - Rmin$).

Next, a configuration in a periphery of memory cell array 10 will be described.

MRAM device 1 further includes a digit line driver transistor 41 provided between power supply voltage Vcc and one end of digit line DL. Digit line driver transistor 41 is constituted with an N-channel MOS transistor, for example. A decode signal activated to H level when a corresponding memory cell row is selected as a data write target in data write, is provided from row decoder 20 to the gate of digit line driver transistor 41.

Therefore, digit line DL in the select row has its one end connected to power supply voltage Vcc and the other end connected to ground voltage GND respectively, in response to turn-on of digit line driver transistor 41. Consequently, the data write current in a prescribed direction from power supply voltage Vcc to ground voltage GND can flow through the digit line in the select row. On the other hand, in data read, digit line driver transistor 41 turns off in each memory cell row, and the current does not flow in each digit line DL.

Row decoder 20, in data read, activates read word line RWL in the select row to H level based on row address RA, and inactivates read word line RWL in a non-select row to L level. Row decoder 20 is assumed to include a not-shown RWL driver. Meanwhile, in data write, each read word line RWL is inactivated to L level.

MRAM device 1 further includes a plurality of data buses DB1 and DB2 as well as DB1' and DB2' provided in a region adjacent to memory cell array 10. Data buses DB1 and DB2 are disposed in a region opposite to data buses DB1' and DB2', with memory cell array 10 interposed.

MRAM device 1 further includes column select gate transistors CSG1–CSGm, and bit line drivers BDVa1–BDVam and BDVb1–BDVbm, provided corresponding to memory cell columns (that is, bit lines BL1–BLm) respectively. In the following, column select gate transistors CSG1–CSGm, and bit line drivers BDVa1–BDVam and BDVb1–BDVbm are collectively referred to as a column select gate transistor CSG and bit line drivers BDVa, BDVb, respectively.

Figure 1:
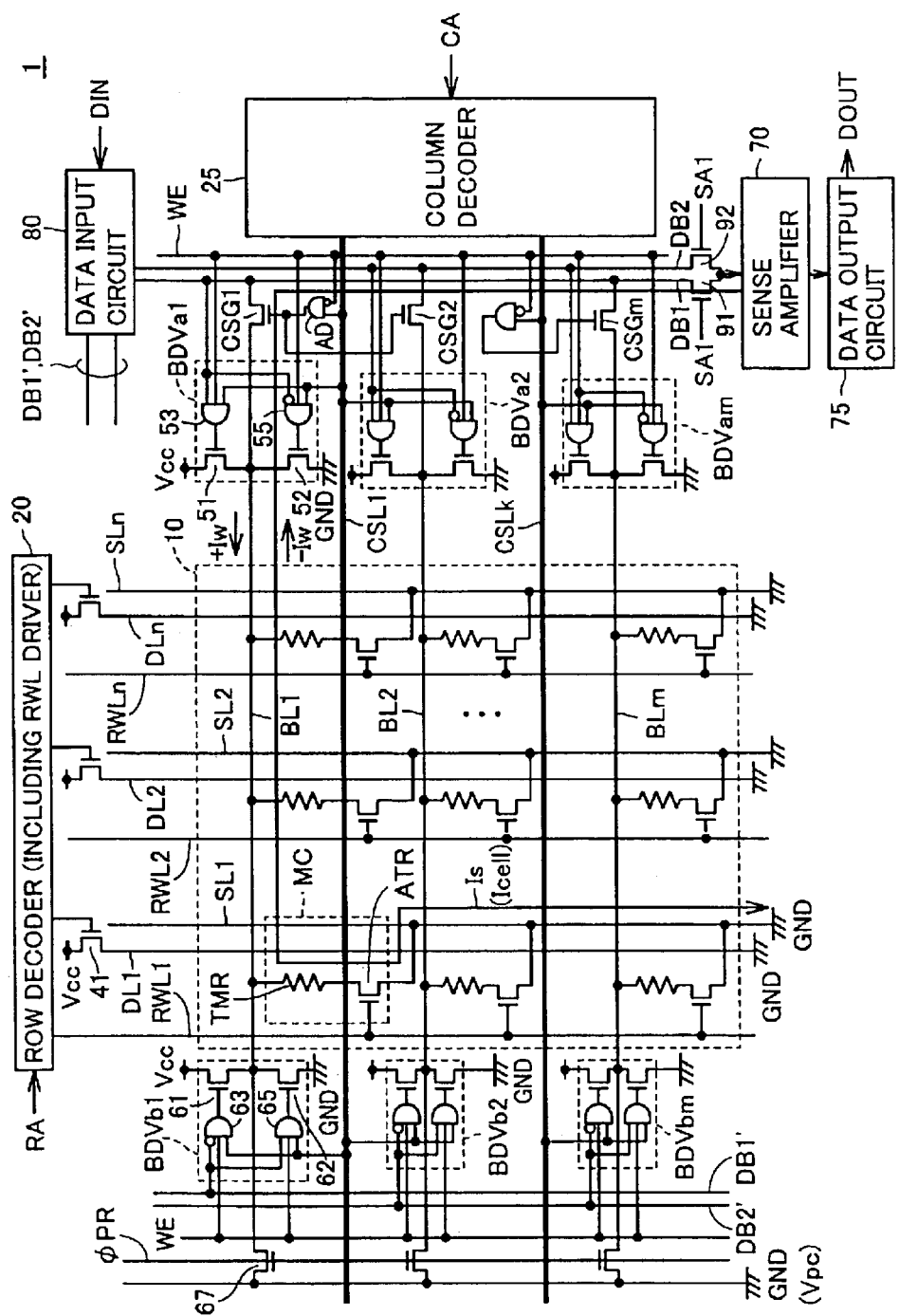
FIG. 1 is a circuit diagram showing an array configuration of an MRAM device according to a first embodiment of the present invention.

Bit line BL is connected to a prescribed one of data buses DB1 and DB2 via corresponding column select gate transistor CSG. In FIG. 1, a configuration is shown, in which an odd-numbered bit line is associated with data bus DB1, while an even-numbered bit line is associated with data bus DB2. For example, bit line BL1 is connected to data bus DB1 via column select gate transistor CSG1, while bit line BL2 is connected to data bus DB2 via column select gate transistor CSG2.

MRAM device 1 further includes k (k: natural number) column select lines CSL1–CSLk, the number of which is determined in accordance with the number of data buses. In the configuration shown in FIG. 1, two data buses DB1 and DB2 are used for carrying out data read. Therefore, k=M/2.

Column decoder 25, in accordance with a decode result of column address CA, that is, a column select result, activates one of column select lines CSL1–CSLk, that corresponds to the column select result, to a select state (H level). In the following, column select lines CSL1–CSLk are collectively referred to as a column select line CSL.

In addition, MRAM device 1 includes an AND circuit AD provided corresponding to each column select line CSL. AND circuit AD outputs an AND logical operation result of a level of a signal of corresponding column select line CSL and an inverted level of a control signal WE set to H level in data write to column select gate transistor CSG.

Each column select gate transistor CSG has the gate electrically coupled to an output node of the AND circuit receiving an input of corresponding column select line CSL. One column select line CSL controls the gates of a plurality of column select gate transistors connected to different data buses respectively. For example, column select gate transistors CSG1 and CSG2 connected to data buses DB1 and DB2 respectively receive an input of AND circuit AD corresponding to column select line CSL1 common to each gate.

Bit line drivers BDVa1–BDVam and BDVb1–BDVbm are provided, corresponding to opposite ends of bit lines BL1–BLm respectively. Each of bit line drivers BDVa1–BDVam has the same configuration, and bit line drivers BDVb1–BDVbm are of the same configuration. Therefore, configurations of bit line drivers BDVa1, BDVb1 will be described as a representative.

Bit line driver BDVa1 includes a bit line driver transistor 51 connected between power supply voltage Vcc and the side of one end of bit line BL1 (column decoder 25 side), a bit line driver transistor 52 connected between the side of one end of bit line BL1 and ground voltage GND, and logic gates 53 and 55 for controlling gate voltages of bit line driver transistors 51 and 52 respectively.

Logic gate 53 outputs to the gate of bit line driver transistor 51, an AND logical operation result among three voltage levels of data bus DB1, control signal WE set to H level in data write, and column select line CSL1. Logic gate 55 outputs to the gate of bit line driver transistor 52, an AND logical operation result among three voltage levels of the inverted level of data bus DB1, control signal WE, and column select line CSL 1.

In contrast, bit line driver BDVb1 includes a bit line driver transistor 61 connected between power supply voltage Vcc and the side of the other end of bit line BL1 (a side opposite to column decoder 25), a bit line driver transistor 62 connected between the side of the other end of bit line BL1 and ground voltage GND, and logic gates 63 and 65 for controlling gate voltages of bit line driver transistors 61 and 62 respectively.

Logic gate 63 outputs to the gate of bit line driver transistor 61, an AND logical operation result among three voltage levels of the inverted level of data bus DB1', control signal WE, and column select line CSL1. Logic gate 65 outputs to the gate of bit line driver transistor 62, an AND logical operation result among three voltage levels of data bus DB1', control signal WE, and column select line CSL1.

MRAM device 1 further includes a data input circuit 80. Data input circuit 80 has an input buffer function, and drives voltages of data buses DB1, DB2 and DB1', DB2' in accordance with input data DIN externally provided. Data input circuit 80 carries out parallel data write of 2 bits, with respect to two bit lines corresponding to one column select line CSL. Specifically, in data write into the bit line in an odd-numbered column among bit lines corresponding to column select line CSL, the voltage of data buses DB1, DB1' is driven. On the other hand, in data write into the bit line in an even-numbered column among the bit lines corresponding to column select line CSL, the voltage of data buses DB2, DB2' is driven.

For example, when the write data of H level ("1") is written into select bit line BL1 corresponding to column select line. CSL1, data buses DB1 and DB1' are driven to H level (power supply voltage Vcc). Similarly, when the write data of H level ("1") is written into select bit line BL2, data buses DB2, DB2' are driven to H level.

In contrast, when the write data of L level ("0") is written into select bit line BL1 corresponding to column select line CSL1, data buses DB1 and DB1' are driven to L level (ground voltage GND). Similarly, when the write data of L level ("0") is written into select bit line BL2, data buses DB2, DB2' are driven to L level.

Thus, in writing the H level data (DIN="1"), a data write current+Iw flows through bit line BL in the select column in a direction from bit line driver BDVa toward BDVb. In writing the L level data (DIN="0"), a data write current−Iw flows through bit line BL in the select column in a direction opposite to that in writing the H level data, that is, a direction from bit line driver BDVb toward BDVa.

The data write current flowing through digit line DL generates a magnetic field extending along the direction of the hard axis in MTJ memory cell MC. On the other hand, the data write current flowing through the bit line in a direction in accordance with the write data generates a magnetic field extending along the direction of the easy axis in MTJ memory cell MC. The write data in accordance with a direction of the data write current flowing in the bit line is magnetically written in memory cell MC in which the data write current is fed through both of corresponding digit line DL and bit line BL.

MRAM device 1 further includes a precharge transistor 67 provided corresponding to each bit line BL, a sense amplifier circuit 70, sense select gate transistors 91, 92, and a data output circuit 75.

Precharge transistor 67 is electrically coupled between a precharge voltage Vpc and each bit line BL. Precharge transistor 67 turns on in response to a precharge signal φPR. For example, ground voltage GND can be used as precharge voltage Vpc.

Precharge signal φPR is activated so as to precharge each bit line BL during a stand-by period, as well as before and after the data write and data read operations during an active period of MRAM device 1. On the other hand, in the data write and data read operations during the active period of the MRAM device, precharge signal φPR is inactivated to L level. In response to this, each bit line BL is disconnected from precharge voltage Vpc (ground voltage GND).

Sense select gate transistors 91 and 92 are connected between data buses DB1, DB2 and sense amplifier circuit 70 respectively. Sense select signals SA1 and SA2 selectively set to H level in data read are input to the gates of sense select gate transistors 91 and 92 respectively. Sense select gate transistors 91 and 92 are constituted with an N-channel MOS transistor, for example. Therefore, in data read, one of sense select gate transistors 91 and 92 turns on, and one of data buses DB1 and DB2 is connected to sense amplifier circuit 70.

Figure 2:
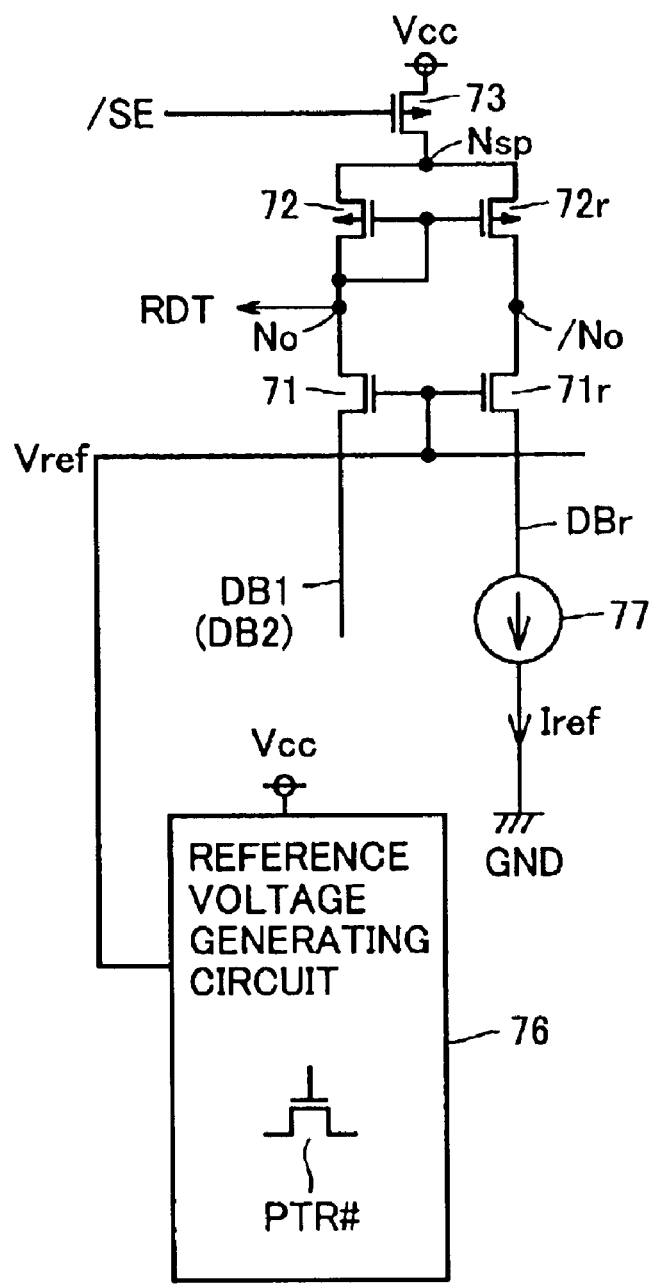
FIG. 2 is a circuit diagram showing a configuration of a sense amplifier circuit.

Referring to FIG. 2, sense amplifier circuit 70 includes an N-channel MOS transistor 71 connected between a node No and data bus DB1 (DB2), an N-channel MOS transistor 71r connected between a node /No and a reference data line DBr, a P-channel MOS transistor 72 connected between a node Nsp and node No, a P-channel MOS transistor 72r connected between node Nsp and node /No, and a P-channel MOS transistor 73 connected between power supply voltage Vcc and node Nsp. Reference data line DBr is connected to a constant current source 77, and a reference current Iref passes therethrough. Here, the power supply voltage of sense amplifier circuit 70 may be a voltage independent of power supply voltage Vcc. It is to be noted that a sign "/" herein represents "reverse", "negative", "complementary", or the like.

Each gate of transistors 72 and 72r is connected to node No. Transistors 72 and 72r constitute a current mirror, and attempts to supply reference Iref equally to each of nodes No and /No.

In addition, sense amplifier circuit 70 has a reference voltage generating circuit 76 generating a constant reference voltage Vref.

A prescribed reference voltage Vref is input to each gate of transistors 71 and 71r. Reference voltage Vref is set, for example, to approximately 400 mV, considering reliability and the like of the tunneling film (insulating film) in the tunneling magneto-resistance element. Thus, memory cell destruction due to application of excessive voltage can be avoided, and operational reliability can be improved.

Transistors 71 and 71r maintain data bus DB1 (DB2) and reference data line DBr at reference voltage Vref level, and amplify the difference between passing currents through data bus DB1 (DB2) and reference data line DBr for conversion to the voltage difference between nodes No and /No. Consequently, a voltage difference ΔV between nodes No and /No has a polarity in accordance with the storage data of the selected memory cell. Therefore, read data RDT can be generated based on the voltage of node No.

A sense enable signal/SE activated to L level in data read is input to the gate of transistor 73. Transistor 73 supplies an operation current in response to activation (L level) of sense enable signal /SE, and operates sense amplifier circuit 70.

An operation in data read will be described in detail. Column select line CSL corresponding to the select column and read word line RWL corresponding to the select row are activated. In response to this, AND circuit AD receiving inputs of an activation signal (H level) of corresponding column select line CSL and an inverted signal (H level in data read) of control signal WE outputs H level. The corresponding column select gate transistor then turns on. Consequently, the following read current path is formed: sense amplifier circuit 70—sense select gate transistor (91 or 92)—select data bus (DB1 or DB2)—column select gate transistor CSG—select bit line—tunneling magneto-resistance element TMR—access transistor ATR—source voltage line SL—ground voltage GND, through which path a read current Is in accordance with the electric resistance of the selected memory cell (that is, the storage data) is fed.

In this configuration, read current Is is comparable to memory cell current Icell passing through the selected memory cell, and is designed to attain Is (Rmax) or Is (Rmin) respectively when the electric resistance of the selected memory cell is Rmax or Rmin. Above-described reference current Iref is designed to attain a median value between Is (Rmax) and Is (Rmin) described above.

An data output circuit 75 has an output buffer function, and outputs read data RDT generated by sense amplifier circuit 70 as output data DOUT to the outside.

A data write and data read operation in the MRAM device described above will be discussed with reference to FIGS. 3 and 4.

Figure 3:
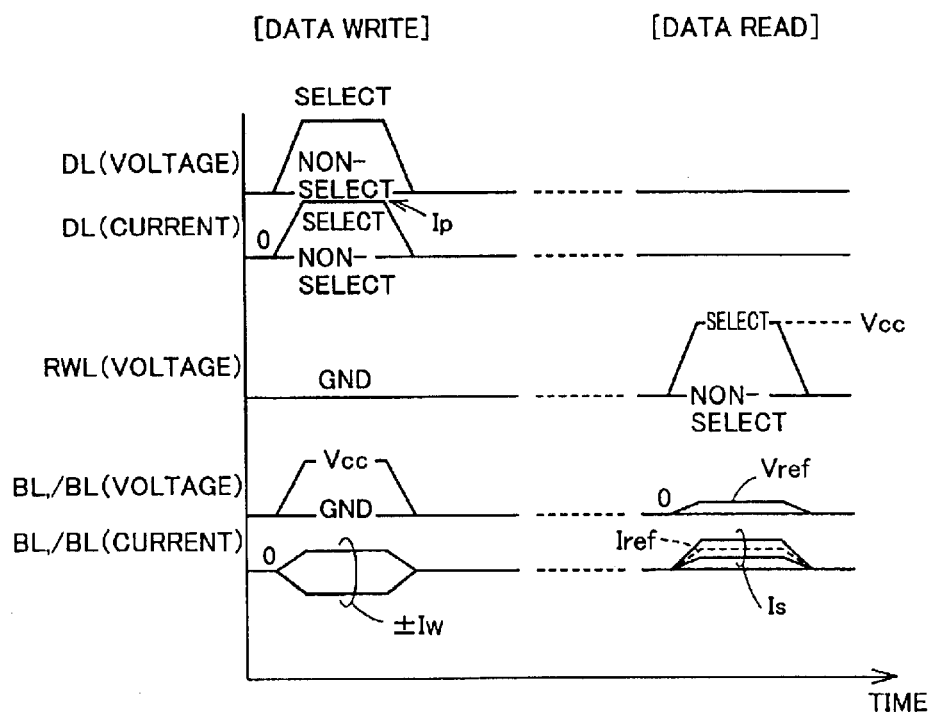
FIG. 3 is a first waveform diagram illustrating a data write and data read operation in the MRAM device.

Referring to FIG. 3, in data write, each read word line RWL is inactivated to L level (ground voltage GND), and digit line DL in the select row is activated. In addition, though not shown, column select line CSL in the select column is activated.

Accordingly, a data write current Ip in a constant direction and a data write current ±Iw in a direction in accordance with the write data are supplied respectively to digit line DL in the select row and bit line BL in the select column. Here, data write currents +Iw and −Iw are collectively referred to as data write current ±Iw. Consequently, data write is carried out with respect to the selected memory cell positioned at an intersection of the digit line in the select row and the bit line in the select column.

In data read, read word line RWL corresponding to the select row is activated to H level, while each digit line DL is inactivated, and no current flows. In addition, though not shown, column select line CSL in the select column is activated.

Bit line BL in the select column is pulled down to ground voltage GND via the selected memory cell. Sense amplifier circuit 70, in response to activation of sense enable signal /SE, pulls up data bus DB1 (DB2) and reference data line DBr to the level of reference voltage Vref as described above, and maintains that voltage level.

Here, read current Is in accordance with the storage data in the selected memory cell flows through the read current path including a bit in the select column. By detecting the current difference between read current Is and the aforementioned reference current Iref, the storage data in the selected memory cell can be read.

Figure 4:
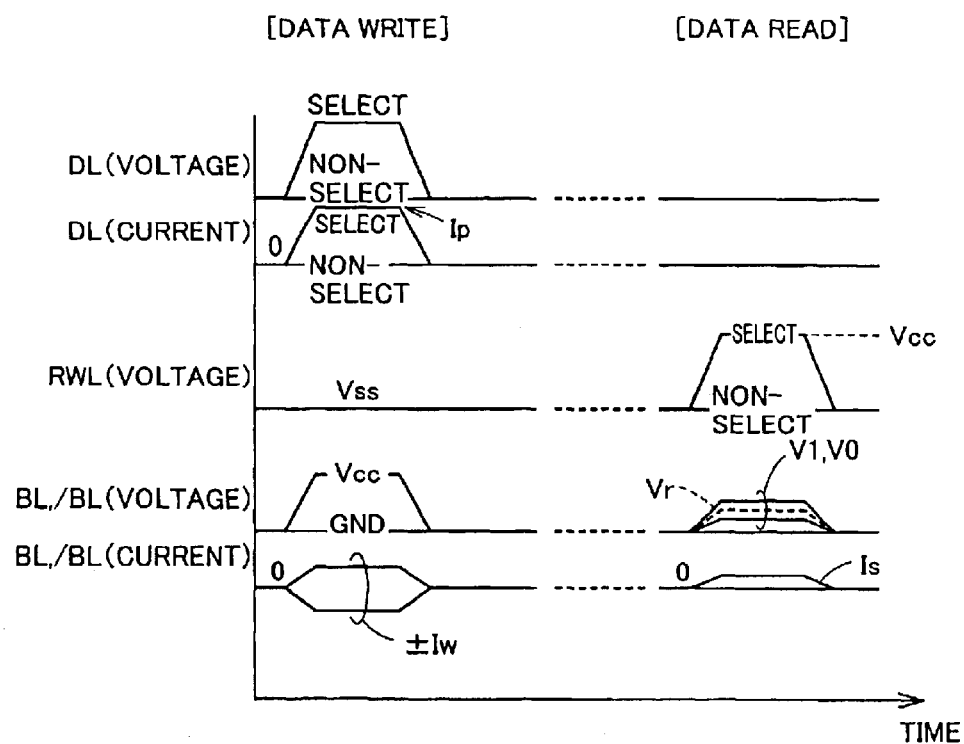
FIG. 4 is a second waveform diagram illustrating a data write and data read operation in the MRAM device.

FIG. 4 shows a variation of another data read operation.

Note that a sense amplifier circuit different from that shown in FIG. 2 is used here.

In data read, the sense amplifier circuit supplies a constant read current Is to bit line BL in the select column via data bus DB1 or DB2. In response to this, a voltage V1 or V0 in accordance with two electric resistances (Rmax, Rmin) of the selected memory cell is generated in bit line BL in the select column based on read current Is.

Therefore, by detecting the voltage difference between a prescribed voltage Vr designed corresponding to an intermediate level of the aforementioned voltages V1 and V0 and the voltage of data bus DB1 or DB2 connected to the select bit line, the storage data in the selected memory cell can be read.

Here, since a general configuration for amplifying/detecting the current difference is applicable to the sense amplifier circuit, detailed description of the circuit configuration thereof will not be provided. In addition, as the data write operation shown in FIG. 4 is the same as in FIG. 3, description thereof will not be repeated.

Any data read operation in FIGS. 3 and 4 is performed based on the read current which flows through the read current path. Therefore, as the resistance of the transistors interposed in the read current path increases, sensing operation will consume time, and high-speed data read will adversely be affected.

This may be caused, for example, by the channel resistance of access transistor ATR in a select cell on the select bit line. Further, this is also the case for column select gate transistor CSG that has turned on, or sense select gate transistors 91 and 92.

Next, a configuration for suppressing the resistance of the transistors on the read current path will be described.

Figure 5:
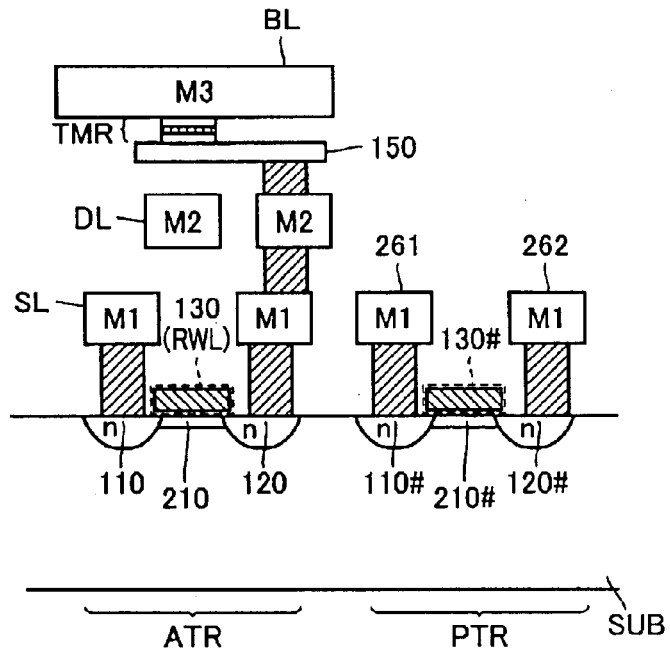
FIG. 5 is a cross-sectional view showing a configuration example of transistors interposed in a read current path, according to the first embodiment.

Referring to FIG. 5, at least some of access transistor ATR and transistors PTR contained in peripheral circuit (hereinafter referred to as peripheral circuit transistors PTR) included in the transistors connected to the read current path are constituted with surface-channel, field-effect transistors. The surface-channel, field-effect transistor is a transistor having a channel, which is a region for carrier transit, provided on the surface of the semiconductor substrate, and has a channel resistance (resistance that a transistor has) lower than a channel-embedded, field-effect transistor having a channel within the semiconductor substrate.

Peripheral circuit transistor PTR is comparable to at least one of column select gate transistor CSG, and sense select gate transistors 91, 92 in FIG. 2, for example.

Access transistor ATR and peripheral circuit transistor PTR are provided on semiconductor substrate SUB.

Figure 12:
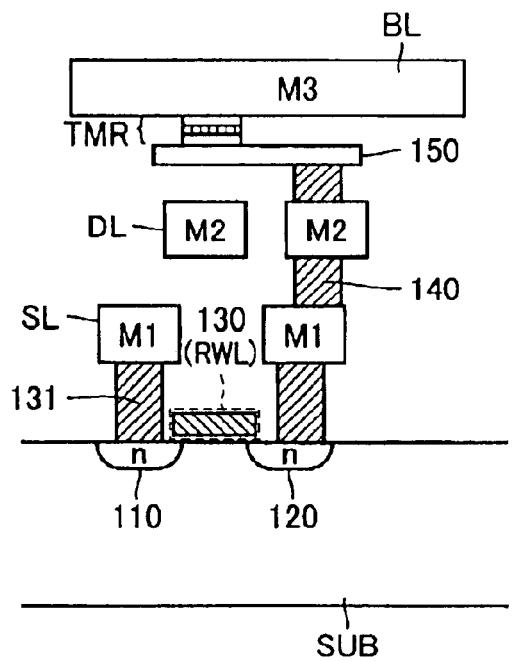
FIG. 12 shows a first configuration example of the MTJ memory cell connected on a semiconductor substrate.

Access transistor ATR includes impurity regions 110, 120 (n-type regions) comparable to a source and drain provided on semiconductor substrate SUB, and a channel region 210 (p-type). Gate region 130 comparable to read word line RWL is formed on the upper surface of such a channel region 210 via a gate insulating film. Gate region 130 is formed with an N-type diffusion polysilicon material. As a connection relation of signal line group with tunneling magneto-resistance element TMR in an upper region of access transistor ATR is the same as that shown in FIG. 12, detailed description thereof will not be repeated. Though a configuration of the N-channel MOS transistor has been described here, a P-channel MOS transistor is also designed in a similar manner. Specifically, in channel region 210, an n-type channel is used instead of p-type, and in gate region 130, a P-type diffusion polysilicon material is used instead of the N-type diffusion polysilicon material.

Similarly, peripheral circuit transistor PTR includes impurity regions 110#, 120# (n-type regions) comparable to a source and drain provided on semiconductor substrate SUB, a channel region 210# (p-type), and a gate region 130# formed on the upper surface of channel region 210# via the gate insulating film. In order to implement a prescribed connection relation shown in FIG. 1, metal interconnections 261 and 262 connected to impurity regions 110# and 120# respectively and a gate interconnection formed in gate region 130# are electrically coupled to a desired node. It is to be noted that the P-channel MOS transistor is designed in a similar manner as described above.

Thus, by designing at least some of transistors connected to the read current path with the surface-channel, field-effect transistor, the resistance in the transistors connected to the read current path in turn-on can be suppressed. As a result, the RC load in the read current path is reduced. In addition, data read with high speed and without misread can be realized, because the read current or the voltage generated in the select bit line of the read current is dependent on the storage data in the selected memory cell (electric resistance).

A setting of a design parameter in the transistors connected to the read current path, according to the first embodiment, will be described with reference to FIG. 6.

A threshold voltage Vth and a gate length Lg of access transistor ATR are designed, considering parameters of a similar type for transistor PTR# contained in peripheral circuit (hereinafter, referred to as peripheral circular transistor PTR#) in which high-speed operation is not required. When the transistors interposed in the read current path are designed to have a low channel resistance, that is, to suppress the channel resistance, an operation with high speed can be expected. On the other hand, a leak current will be large in turn-off. Therefore, for a circuit in which not high-speed but a precise operation is expected (a circuit generating a prescribed voltage, for example), in order to reduce the leak current, it is desirable to design a large channel resistance. In the present embodiment, one example for peripheral circuit transistor PTR# shown in FIG. 6 is at least one of the transistors constituting reference voltage generating circuit 76 in FIG. 2.

The threshold voltage of peripheral circuit transistor PTR# is represented as Vth (mid), and the gate length thereof is represented as LG (mid). On the other hand, access transistor ATR is a transistor having a minimum gate length Lg (min) and a minimum absolute value for the threshold voltage Vth (min), compared to peripheral circuit transistor PTR# constituting the peripheral circuit.

In order to suppress the channel resistance in the selected memory cell on the select bit line in access transistor ATR, not only the surface-channel, field-effect transistor configuration shown in FIG. 5 is adopted, but also gate length Lg (min) is reduced to the minimum. Thus, the channel resistance is suppressed. Therefore, the gate length is designed to satisfy a relation of Lg (mid)>Lg (min) in access transistor ATR.

In addition, designing the absolute value for the threshold voltage to satisfy a relation of Vth (mid)>Vth (min) is also effective for suppressing the channel resistance. The threshold voltage can be designed to a different level, by adjusting an impurity density implanted onto the substrate of the transistor and a thickness of the gate insulating film. As a result, the channel resistance per a unit size of access transistor ATR is made smaller than that of peripheral circuit transistor PTR#.

Figure 6:
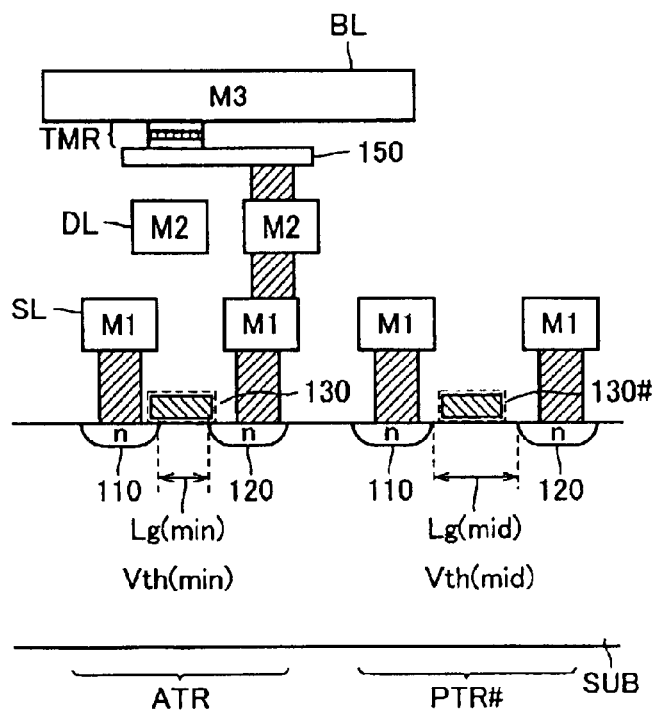
FIG. 6 shows a setting of a design parameter in the transistors connected to the read current path, according to the first embodiment.
Figure 13:
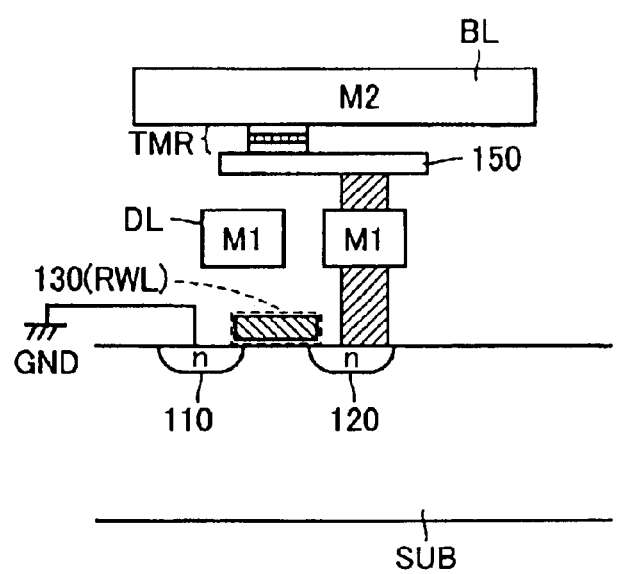
FIG. 13 shows a second configuration example of the MTJ memory cell connected on the semiconductor substrate.
Figure 14:
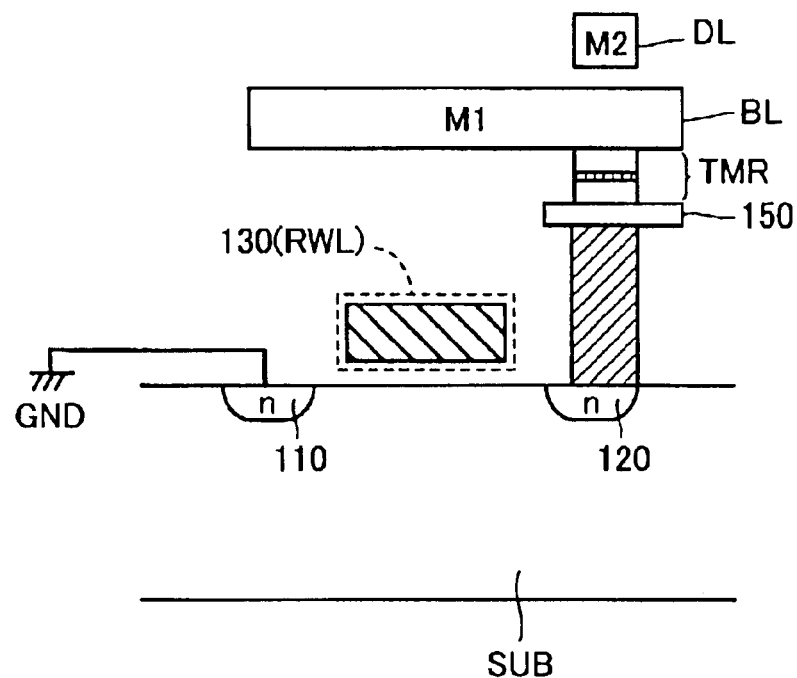
FIG. 14 shows a third configuration example of the MTJ memory cell connected on the semiconductor substrate.

Here, in access transistor ATR shown in FIGS. 5 and 6, it is also possible to form impurity region 110 extending in a row direction so as to act as source voltage line SL, as in the configuration shown in FIGS. 13 and 14.

Consequently, by further providing a prescribed design, the channel resistance of the transistors interposed in the read current path can be suppressed. The RC load in the read current path can be reduced, and data read with high speed and without misread can be realized.

Second Embodiment

Figure 7:
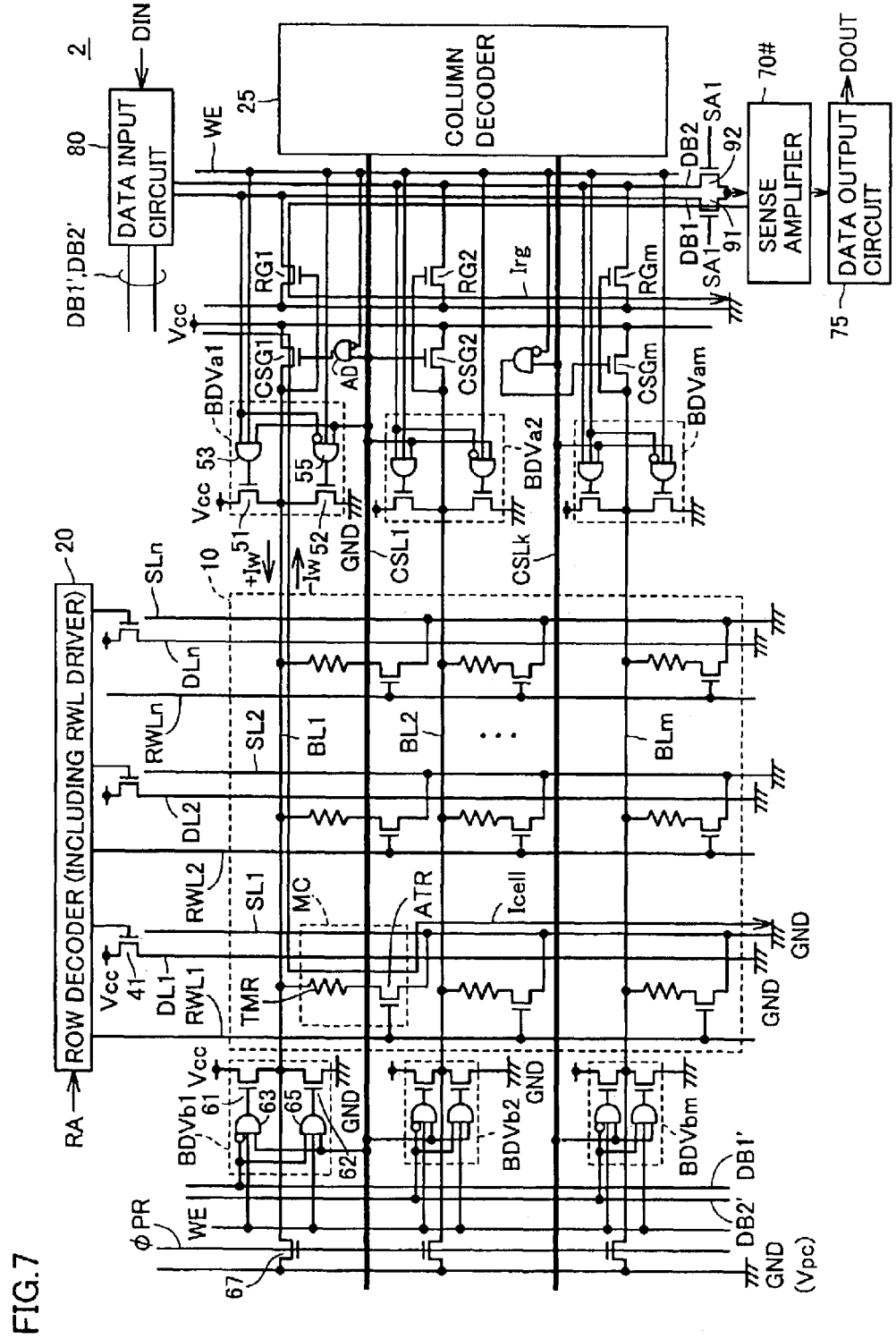
FIG. 7 is a circuit diagram showing an array configuration of an MRAM device according to a second embodiment.

Referring to FIG. 7, an MRAM device 2 according to the second embodiment is different from MRAM device 1 according to the embodiment shown in FIG. 1 in that it further includes read gate transistors RG1–RGm, and has a different connection configuration of bit line BL with data buses DB1 and DB2. Moreover, MRAM device 2 is different in that a sense amplifier circuit 70# replaces sense amplifier 70 detecting the storage data based on the voltage or the current that appears in data bus DB1 or DB2.

In the configuration according to the second embodiment, column select gate transistors CSG1–CSGm are electrically coupled between corresponding bit lines BL1–BLm and power supply voltage Vcc, respectively. Since on/off of column select gate transistors CSG1–CSGm is controlled in a manner similar to FIG. 1, detailed description thereof will not be repeated.

Read gate transistors RG1–RGm are electrically coupled between a prescribed one of data buses DB1 and DB2 and ground voltage GND, and the gates thereof are connected to bit lines BL1–BLm respectively. In the following, read gate transistors RG1–RGm are collectively referred to as a read gate transistor RG.

With such a configuration, in data read, the select bit line is pulled up to power supply voltage Vcc via corresponding column select gate transistor CSG, while it is pulled down to ground voltage GND via the selected memory cell. Therefore, a potential in accordance with the electric resistance of the selected memory cell (that is, the storage data) is generated in the select bit line. The read gate transistor in the selected memory cell column drives a prescribed one of data buses DB1 and DB2 to ground voltage GND with a driving power in accordance with the potential of the select bit line.

Therefore, by comparing the current difference between the passing current through data bus DB1 or DB2 and a prescribed reference current using sense amplifier circuit 70#, data read as in the first embodiment can be performed.

Alternatively, when the data read operation is started after precharge to a prescribed voltage for each of data buses DB1 and DB2, voltage of data buses DB1 and DB2 will vary in accordance with the storage data in the selected memory cell. Therefore, data read from the selected memory cell can be carried out also by detecting the voltage of one data bus corresponding to the selected memory cell with sense amplifier circuit 70#.

As described above, a configuration for driving data bus DB1 or DB2 via read gate transistor RG can suppress the RC load in the path for the current passing through the selected memory cell. Thus, the data read operation with higher speed can be implemented.

In the configuration according to the second embodiment, the read current path described in the first embodiment conceptually includes a path for the passing current through the selected memory cell (memory cell current Icell), and a path for a read drive current Irg passing through data buses DB1, DB2 and read gate transistor RG.

The read gate transistor in the select column is connected to data buses DB1, DB2 in a turn-on state. Therefore, if read gate transistor RG is configured in a manner similar to the transistors connected to the read current path shown in the first embodiment, as shown in FIGS. 5 and 6, the channel resistance of the transistors interposed in the read current path can be suppressed. Consequently, in accordance with the prescribed design, the RC load in the read current path is reduced, and data read with high speed and without misread can be realized, because the read current or the voltage generated in the select bit line by the read current is dependent on the storage data of the selected memory cell (electric resistance).

In the above, a configuration implementing suppression of the channel resistance and high-speed data read without misread by configuring the transistors interposed in the read current path in a prescribed manner, and setting a prescribed design value therefor has been described.

Meanwhile, in data write, sufficient data write current should be supplied to digit line DL and bit line BL corresponding to the select row and select column respectively. Accordingly, in driver transistors for supplying the data write current as well, the channel resistance of the transistor as described above will adversely affect a supplied amount of the data write current. In order to have sufficient current drivability, digit line driver transistor 41 shown in FIGS. 1 and 7 and bit line driver transistors 51, 52, 61, and 62 are constituted with the surface-channel, field-effect transistor. In addition, the transistor suppressing the channel resistance should be designed. Therefore, as described in FIGS. 5 and 6, digit line driver transistor 41 and bit line driver transistors 51, 52, 61, and 62 are designed to satisfy gate length Lg (min) (Lg (mid)>Lg (min)). Further, those transistors are also designed to satisfy the absolute value for the threshold voltage Vth (mid) (Vth (mid)>Vth (min)).

Thus, by configuring the driver transistor supplying the data write current with a prescribed setting condition, the channel resistance can be suppressed, and the data write current can sufficiently be supplied in data write.

In addition, in a precharge operation performed before data read as well, the channel resistance of precharge transistor 67 precharging bit line BL will adversely affect the precharge operation. In order to sufficiently drive precharge voltage Vpc to bit line BL, precharge transistor 67 shown in FIGS. 1 and 7 is constituted with the surface-channel, field-effect transistor. Moreover, the transistor suppressing the channel resistance should be designed. Therefore, as described in FIGS. 5 and 6, precharge transistor 67 is designed so as to satisfy gate length Lg (min) (Lg (mid)>Lg (min)). Further, the transistor is also designed so as to satisfy the absolute value for the threshold voltage Vth (mid) (Vth (mid)>Vth (min)).

Thus, by configuring the precharge transistor supplying precharge voltage Vpc with a prescribed setting condition, the channel resistance can be suppressed, and the high speed operation in precharge can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
   a plurality of magnetic memory cells arranged in matrix, and including a magneto-resistance element each having an electric resistance variable in accordance with magnetically written storage data;
   a data line through which a read current is fed in accordance with the storage data in a selected memory cell corresponding to an address signal, among said plurality of magnetic memory cells in data read; and
   a peripheral circuit for carrying out data read and data write for said selected memory cell; wherein
   said peripheral circuit includes a sense amplifier circuit reading said storage data in said selected memory cell based on said read current; and
   at least some of transistors allowing passage of said read current are designed to have a channel resistance per a unit channel width lower than at least some of transistors having a maximum channel resistance per a unit channel width among transistors in said peripheral circuit.

2. The thin film magnetic memory device according to claim 1, wherein
   said at least some of transistors allowing passage of said read current have an absolute value for a threshold voltage lower than said at least some of transistors having a maximum absolute value for the threshold voltage among the transistors in said peripheral circuit.

3. The thin film magnetic memory device according to claim 1, wherein
   said at least some of transistors allowing passage of said read current have a gate length shorter than said at least some of transistors having a maximum gate length among the transistors in said peripheral circuit.

4. The thin film magnetic memory device according to claim 1, wherein
   said at least some of transistors allowing passage of said read current are fabricated as a surface-channel, field-effect transistor.

5. The thin film magnetic memory device according to claim 1, wherein
   said data line includes a plurality of bit lines provided corresponding to prescribed sections of said plurality of magnetic memory cells respectively,
   each of said magnetic memory cells further has an access transistor connected in series to said magneto-resistance element between the corresponding bit line and a fixed voltage and selectively turning on, and
   said at least some of transistors allowing passage of said read current include said access transistor.

6. The thin film magnetic memory device according to claim 1, wherein
   said data line includes a plurality of bit lines provided corresponding to prescribed sections of said plurality of magnetic memory cells respectively,
   said peripheral circuit further includes a plurality of select gate transistors for selectively connecting said plurality of bit lines to said sense amplifier circuit, and
   said at least some of transistors allowing passage of said read current include at least one of said plurality of select gate transistors.

7. The thin film magnetic memory device according to claim 1, wherein
   said data line includes a plurality of read data lines provided corresponding to prescribed sections of said plurality of magnetic memory cells respectively,
   said peripheral circuit further includes a plurality of select gate transistors provided between said plurality of read data lines and said sense amplifier respectively, and selectively connecting said plurality of read data lines to the sense amplifier, and
   said at least some of transistors allowing passage of said read current include at least one of said plurality of select gate transistors.

8. The thin film magnetic memory device according to claim 1, wherein said data line includes a plurality of bit lines provided corresponding to prescribed sections of said plurality of magnetic memory cells respectively, and a read data line connected to said sense amplifier, each of said magnetic memory cells further has an access transistor connected in series to said magneto-resistance element between the corresponding bit line and a fixed voltage, and turning on at least in said select transistor, a select bit line connected to said fixed voltage via said selected memory cell among said plurality of bit lines is further connected to a voltage different from said fixed voltage in data read, said peripheral circuit includes a read gate transistor for driving said read data line with a driving power in accordance with a potential of said select bit line, and said at least some of transistors allowing passage of said read current include at least one of said read gate transistors.

9. A thin film magnetic memory device, comprising:

a plurality of magnetic memory cells arranged in matrix, and including a magneto-resistance element each having an electric resistance variable in accordance with magnetically written storage data;

a data line through which a read current is fed in accordance with the storage data in a selected memory cell corresponding to an address signal, among said plurality of magnetic memory cells in data read; and a peripheral circuit for carrying out data read and data write for said selected memory cell; wherein said peripheral circuit includes a sense amplifier circuit reading said storage data in said selected memory cell based on said read current; and at least some of transistors allowing passage of said read current are designed to have an absolute value for a threshold voltage lower than at least some of transistors having a maximum absolute value for the threshold voltage among transistors in said peripheral circuit.

10. The thin film magnetic memory device according to claim 9, wherein said at least some of transistors allowing passage of said read current have a channel resistance per a unit channel width lower than at least some of transistors having a maximum channel resistance per a unit channel width among the transistors in said peripheral circuit.

11. The thin film magnetic memory device according to claim 9, further comprising a plurality of write current lines for selectively generating a data write magnetic field applied to the selected memory cell corresponding to the address signal, among said plurality of magnetic memory cells, wherein said peripheral circuit further includes a plurality of write driver transistors provided corresponding to said plurality of write current lines respectively, so as to supply a data write current to the corresponding current write line, and each of said write driver transistors is designed to have an absolute value for a threshold voltage lower than said at least some of transistors having a maximum absolute value for the threshold voltage among the transistors in said peripheral circuit.

12. The thin film magnetic memory device according to claim 9, wherein said peripheral circuit further includes a precharge transistor provided between said data line and a prescribed voltage, for precharging said data line to said prescribed voltage, and said precharge transistor is designed to have an absolute value for a threshold voltage lower than said at least some of transistors having a maximum absolute value for the threshold voltage among the transistors in said peripheral circuit.

13. A thin film magnetic memory device, comprising:

a plurality of magnetic memory cells arranged in matrix, and including a magneto-resistance element each having an electric resistance variable in accordance with magnetically written storage data;

a data line through which a read current is fed in accordance with the storage data in a selected memory cell corresponding to an address signal, among said plurality of magnetic memory cells in data read; and a peripheral circuit for carrying out data read and data write for said selected memory cell; wherein said peripheral circuit includes a sense amplifier circuit reading said storage data in said selected memory cell based on said read current; and at least some of transistors allowing passage of said read current are designed to have a gate length shorter than at least some of transistors having a maximum gate length among transistors in said peripheral circuit.

14. The thin film magnetic memory device according to claim 13, wherein said at least some of transistors allowing passage of said read current have a channel resistance per a unit channel width lower than at least some of transistors having a maximum channel resistance per a unit channel width among the transistors in said peripheral circuit.

15. The thin film magnetic memory device according to claim 13, further comprising a plurality of write current lines for selectively generating a data write magnetic field applied to the selected memory cell corresponding to the address signal, among said plurality of magnetic memory cells, wherein said peripheral circuit further includes a plurality of write driver transistors provided corresponding to said plurality of write current lines respectively, so as to supply a data write current to the corresponding current write line, and each of said write driver transistors is designed to have a gate length shorter than said at least some of transistors having a maximum gate length among the transistors in said peripheral circuit.

16. The thin film magnetic memory device according to claim 13, wherein said peripheral circuit further includes a precharge transistor provided between said data line and a prescribed voltage, for precharging said data line to said prescribed voltage, and said precharge transistor is designed to have a gate length shorter than said at least some of transistors having a maximum gate length among the transistors in said peripheral circuit.

17. A thin film magnetic memory device, comprising:

a plurality of magnetic memory cells arranged in matrix, and including a magneto-resistance element each having an electric resistance variable in accordance with magnetically written storage data;

a plurality of write current lines for selectively generating a data write magnetic field applied to a selected memory cell corresponding to an address signal, among said plurality of magnetic memory cells; and a peripheral circuit for carrying out data read and data write for said selected memory cell; wherein said peripheral circuit includes a plurality of write driver transistors provided corresponding to said plurality of write current lines respectively, so as to supply a data write current to the corresponding current write line; and each of said write driver transistors is designed to have a channel resistance per a unit channel width lower than at least some of transistors having a maximum channel resistance per a unit channel width among transistors in said peripheral circuit.

18. The thin film magnetic memory device according to claim 17, wherein each of said write driver transistors has an absolute value for a threshold voltage lower than at least some of transistors having a maximum absolute value for the threshold voltage among the transistors in said peripheral circuit.

19. The thin film magnetic memory device according to claim 17, wherein each of said write driver transistors has a gate length shorter than at least some of transistors having a maximum gate length among the transistors in said peripheral circuit.

20. The thin film magnetic memory device according to claim 17, wherein each of said write driver transistors is fabricated as a surface-channel, field-effect transistor.

21. A thin film magnetic memory device, comprising:

a plurality of magnetic memory cells arranged in matrix, and including a magneto-resistance element each having an electric resistance variable in accordance with magnetically written storage data;

a data line through which a read current is fed in accordance with the storage data in a selected memory cell corresponding to an address signal, among said plurality of magnetic memory cells in data read; and a peripheral circuit for carrying out data read and data write for said selected memory cell; wherein said peripheral circuit includes a precharge transistor provided between said data line and a prescribed voltage, for precharging said data line to said prescribed voltage; and said precharge transistor is designed to have a channel resistance per a unit channel width lower than at least some of transistors having a maximum channel resistance per a unit channel width among transistors in said peripheral circuit.

22. The thin film magnetic memory device according to claim 21, wherein said precharge transistor has an absolute value for a threshold voltage lower than at least some of transistors having a maximum absolute value for the threshold voltage among the transistors in said peripheral circuit.

23. The thin film magnetic memory device according to claim 21, wherein said precharge transistor has a gate length shorter than at least some of transistors having a maximum gate length among the transistors in said peripheral circuit.

24. The thin film magnetic memory device according to claim 21, wherein said precharge transistor is fabricated as a surface-channel, field-effect transistor.

25. A memory device, comprising:

a plurality of memory cells arranged in a matrix, and from each of which data is read based on an electric resistance variable in accordance with written storage data;

a data line through which a read current is fed in accordance with the storage data in a selected memory cell corresponding to an address signal, among said plurality of memory cells in data read; and a peripheral circuit for carrying out data read and data write for said selected memory cell; wherein said peripheral circuit includes a sense amplifier circuit reading said storage data in said selected memory cell based on said read current; and at least some of transistors, allowing passage of said read current, are designed to have a channel resistance per a unit channel width lower than at least some of transistors having a maximum channel resistance per a unit channel width among transistors in said peripheral circuit.

26. A memory device, comprising:

a plurality of memory cells arranged in a matrix, and from each of which data is read based on an electric resistance variable in accordance with written storage data;

a data line through which a read current is fed in accordance with the storage data in a selected memory cell corresponding to an address signal, among said plurality of memory cells in data read; and a peripheral circuit for carrying out data read and data write for said selected memory cell; wherein said peripheral circuit includes a sense amplifier circuit reading said storage data in said selected memory cell based on said read current; and at least some of transistors, allowing passage of said read current, are designed to have an absolute value for a threshold voltage lower than at least some of transistors having a maximum absolute value for the threshold voltage among transistors in said peripheral circuit.

27. A memory device, comprising:

a plurality of memory cells arranged in a matrix, and from each of which data is read based on an electric resistance variable in accordance with written storage data;

a data line through which a read current is fed in accordance with the storage data in a selected memory cell corresponding to an address signal, among said plurality of magnetic memory cells in data read; and a peripheral circuit for carrying out data read and data write for said selected memory cell; wherein said peripheral circuit includes a sense amplifier circuit reading said storage data in said selected memory cell based on said read current; and at least some of transistors, allowing passage of said read current, are designed to have a gate length shorter than at least some of transistors having a maximum gate length among transistors in said peripheral circuit.

28. A memory device, comprising:

a plurality of memory cells arranged in a matrix, and each storing data upon receiving supply of a data write current in accordance with storage data;

a plurality of write current lines provided for selectively supplying said data write current to a selected memory cell corresponding to an address signal, among said plurality of magnetic memory cells; and a peripheral circuit for carrying out data read and data write for said selected memory cell; wherein said peripheral circuit includes
- a plurality of write driver transistors provided corresponding to said plurality of write current lines respectively, so as to supply said data write current to the corresponding current write line; and
- each of said write driver transistors is designed to have a channel resistance per a unit channel width lower than at least some of transistors having a maximum channel resistance per a unit channel width among transistors in said peripheral circuit.

29. A memory device, comprising:

a plurality of memory cells arranged in a matrix, and each storing data upon receiving supply of a data write current in accordance with storage data:

a plurality of write current lines provided for selectively supplying said data write current to a selected memory cell corresponding to an address signal, among said plurality of magnetic memory cells; and a peripheral circuit for carrying out data read and data write for said selected memory cell; wherein said peripheral circuit includes
- a plurality of write driver transistors provided so as to supply said data write current to the selected current write line; and
- each of said write driver transistors is designed to have a channel resistance per a unit channel width lower than at least some of transistors having a maximum channel resistance per a unit channel width among transistors in said peripheral circuit.

30. A memory device, comprising:

a plurality of memory cells arranged in a matrix, and from each of which data is read based on an electric resistance variable in accordance with written storage data;

a data line through which a read current is fed in accordance with the storage data in a selected memory cell corresponding to an address signal, among said plurality of magnetic memory cells in data read; and a peripheral circuit for carrying out data read and data write for said selected memory cell; wherein said peripheral circuit includes
- a precharge transistor provided between said data line and a prescribed voltage, for precharging said data line to said prescribed voltage; and
- said precharge transistor is designed to have a channel resistance per a unit channel width lower than at least some of transistors having a maximum channel resistance per a unit channel width among transistors in said peripheral circuit.

* * * * *